United States Patent
Chen

(10) Patent No.: US 11,755,814 B2
(45) Date of Patent: Sep. 12, 2023

(54) METHOD AND APPARATUS FOR LAYOUT PATTERN SELECTION

(71) Applicant: ASML NETHERLANDS B.V., Veldhoven (NL)

(72) Inventor: Wei-jie Chen, Shenzhen (CN)

(73) Assignee: ASML NETHERLANDS B.V., Veldhoven (NL)

( * ) Notice: Subject to any disclaimer, the term of this patent is extended or adjusted under 35 U.S.C. 154(b) by 9 days.

(21) Appl. No.: 17/422,520

(22) PCT Filed: Jan. 10, 2020

(86) PCT No.: PCT/EP2020/050494
§ 371 (c)(1),
(2) Date: Jul. 13, 2021

(87) PCT Pub. No.: WO2020/156777
PCT Pub. Date: Aug. 6, 2020

(65) Prior Publication Data
US 2022/0100935 A1    Mar. 31, 2022

(30) Foreign Application Priority Data

Jan. 29, 2019  (WO) ................ PCT/CN2019/073714

(51) Int. Cl.
*G06F 30/30* (2020.01)
*G06F 30/27* (2020.01)
(Continued)

(52) U.S. Cl.
CPC ............ *G06F 30/398* (2020.01); *G03F 7/705* (2013.01); *G06F 30/27* (2020.01); *G06F 30/30* (2020.01);
(Continued)

(58) Field of Classification Search
None
See application file for complete search history.

(56) References Cited

U.S. PATENT DOCUMENTS 5,229,872 A    7/1993   Mumola
6,046,792 A    4/2000   Van Der Werf et al.
(Continued)

FOREIGN PATENT DOCUMENTS

CN    107797391    3/2018
JP    2010117716   5/2010
(Continued)

OTHER PUBLICATIONS

B. Yu et al., "Accurate lithography hotspot detection based on principal component analysis-support vector machine classifier with hierarchical data clustering," J. Micro/Nanolith. MEMS MOEMS, vol. 14(1), Jan.-Mar. 2015, 13 pages. (Year: 2015).*

(Continued)

*Primary Examiner* — Leigh M Garbowski
(74) *Attorney, Agent, or Firm* — Pillsbury Winthrop Shaw Pittman, LLP

(57) ABSTRACT

A method for determining a training pattern in a layout patterning process. The method includes generating a plurality of features from patterns in a pattern set; grouping the patterns in the pattern set into individual groups based on similarities in the plurality of generated features; and selecting representative patterns from the individual groups to determine the training pattern. In some embodiments, the method is a method for training a machine learning model in a layout patterning process. The method may include, for example, providing representative patterns from the individual groups to the machine learning model to train the machine learning model to predict a continuous transmission (Continued)

mask (CTM) map for optical proximity correction (OPC) in the layout patterning process.

20 Claims, 13 Drawing Sheets

(51) Int. Cl.
 *G03F 7/00* (2006.01)
 *G06N 3/08* (2023.01)
 *G06F 30/398* (2020.01)
 *G03F 1/36* (2012.01)

(52) U.S. Cl.
 CPC .............. *G06N 3/08* (2013.01); *G03F 1/36* (2013.01); *G03F 7/70441* (2013.01)

(56) References Cited

U.S. PATENT DOCUMENTS

| | | | |
|---|---|---|---|
| 7,587,704 B2 | 9/2009 | Ye et al. | |
| 8,200,468 B2 | 6/2012 | Ye et al. | |
| 8,336,006 B2* | 12/2012 | Kodera | G06F 30/39 716/132 |
| 10,198,550 B2* | 2/2019 | Lutich | G06F 30/39 |
| 10,386,726 B2* | 8/2019 | Cao | G03F 1/36 |
| 11,403,564 B2* | 8/2022 | Chiang | G06T 7/001 |
| 2007/0031745 A1 | 2/2007 | Ye et al. | |
| 2007/0050749 A1 | 3/2007 | Ye et al. | |
| 2008/0077907 A1 | 3/2008 | Kulkarni | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2010/0122225 A1 | 5/2010 | Cao et al. | |
| 2010/0162197 A1 | 6/2010 | Ye et al. | |
| 2010/0180251 A1 | 7/2010 | Ye et al. | |
| 2013/0061184 A1 | 3/2013 | Guo et al. | |
| 2018/0046072 A1* | 2/2018 | Lutich | G06F 30/30 |
| 2018/0285510 A1 | 10/2018 | Lutich | |
| 2018/0314163 A1 | 11/2018 | Liu | |
| 2019/0129297 A1 | 5/2019 | Shim | |

FOREIGN PATENT DOCUMENTS

| | | |
|---|---|---|
| JP | 2016145887 | 8/2016 |
| WO | 2016096308 | 6/2016 |
| WO | 2016177548 | 11/2016 |
| WO | 2019162346 | 8/2019 |
| WO | 2019190566 | 10/2019 |

OTHER PUBLICATIONS

T. Matsunawa et al., "Laplacian eigenmaps- and Bayesian clustering-based layout pattern sampling and its applications to hotspot detection and optical proximity correction," J. Micro/Nanolith. MEMS MOEMS, vol. 15(4), Oct.-Dec. 2016, 11 pages. (Year: 2016).*

International Search Report and Written Opinion issued in corresponding PCT Patent Application No. PCT/EP2020/050494, dated May 12, 2020.

Spence, C: "Full-Chip Lithography Simulation and Design Analysis: How OPC Is Changing IC Design", Proc. of SPIE, vol. 5751, pp. 1-14 (2005).

Yang, H. et al.: "Imbalance aware lithography hotspot detection: a deep learning approach", Proc. of SPIE, vol. 10524 (Mar. 28, 2017).

Japanese Office Action issued in corresponding Japanese Patent Application No. 2021-539427, dated Sep. 16, 2022.

* cited by examiner

METHOD AND APPARATUS FOR LAYOUT PATTERN SELECTION

CROSS-REFERENCE TO RELATED APPLICATIONS

This application is the U.S. national phase entry of PCT Patent Application No. PCT/EP2020/050494 which was filed on Jan. 10, 2020, which claims the benefit of priority of PCT Patent Application No. PCT/CN2019/073714 which was filed on Jan. 29, 2019 and which is incorporated herein in its entirety by reference.

TECHNICAL FIELD

The description herein relates generally to mask manufacturing and patterning processes. More particularly, the description relates to a method and apparatus for layout pattern selection to train machine learning models.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish an individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices may be mounted on a carrier, connected to pins, etc.

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc. One or more metrology processes are typically involved in the patterning process.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method for training a machine learning model for a wafer patterning process. The method comprises generating a plurality of features for each pattern in a pattern set; grouping the patterns in the pattern set into individual groups based on similarities in the plurality of generated features; and providing representative patterns from the individual groups to computational lithography applications for a wafer patterning process. The applications may include source mask optimization (SMO), optical proximity correction (OPC), lithography manufacturability check (LMC), etc.

In an embodiment, the plurality of features generated from the patterns in the pattern set are in addition to geometrical information and/or vertex information already included in the pattern set. In an embodiment, the SMO comprises a source and mask co-optimization for a full-chip layout for a wafer in the wafer patterning process. In an embodiment, the OPC comprises a full-chip OPC for a wafer in the wafer patterning process. In an embodiment, the LMC comprises a lithography manufacturability and lithography performance check for a full-chip layout for a wafer in the wafer patterning process. In an embodiment, the plurality of generated features comprises geometrical features and lithography aware features. In an embodiment, grouping the patterns in the pattern set into individual groups based on the similarities in the plurality of generated features comprises using a machine learning clustering method to cluster the patterns in the pattern set into individual groups based on the similarities in the plurality of generated features.

According to another embodiment, there is provided a method for determining a training pattern for a wafer patterning process. The method comprises generating a plurality of features from patterns in a pattern set; grouping the patterns in the pattern set into individual groups based on similarities in the plurality of generated features; and selecting representative patterns from the individual groups to determine the training pattern.

In an embodiment, the plurality of generated features comprises geometrical features and lithography aware features. The geometrical features comprise one or more of target mask images, frequency maps, pattern density maps, or pattern occurrences of the unique patterns in the pattern set. The lithography aware features comprise one or more of sub-resolution assist feature guidance maps (SGM), diffraction orders, or diffraction patterns of the patterns in the pattern set. In an embodiment, the plurality of features generated from the patterns in the pattern set are in addition to geometrical information and/or vertex information already included in the pattern set.

In an embodiment, grouping of the patterns in the pattern set into groups based on the plurality of generated features is performed using unsupervised machine learning. In an embodiment, grouping the patterns in the pattern set into individual groups based on the similarities in the plurality of generated features comprises clustering the unique patterns in the pattern set into individual groups based on the similarities in the plurality of generated features. The clustering comprises a sequential series of clustering steps performed using different ones of the plurality of generated features for different clustering steps, the sequential series of clustering steps forming sub-groups of the patterns in the pattern set such that the representative patterns are selected from the sub-groups to determine the training pattern. In an embodiment, the clustering comprises a machine learning clustering method (e.g., k-means clustering).

In an embodiment, the sequential series of clustering steps comprise cross validation steps performed using a given feature for a given step. The cross validation steps include adjusting which patterns are included in a given sub group.

In an embodiment, selecting representative patterns from the individual groups to determine the training pattern comprises selecting a target number of representative patterns. The target number of representative patterns is determined based on stop criteria. The stop criteria are configured to facilitate variation in the training pattern. In an embodiment, the method further comprises determining an amount of variation in the training pattern. In an embodiment, the stop criteria are further configured to ensure the amount of variation in the training pattern breaches a variation amount threshold.

In an embodiment, the target number of representative patterns is randomly selected from the individual groups. In an embodiment, the target number of representative patterns is re-randomly selected responsive to the amount of variation in the training pattern not breaching the variation amount threshold.

In an embodiment, selecting representative patterns from the individual groups to determine the training pattern comprises selecting a most central pattern from each individual group. The most central pattern the pattern closest to a centroid of a specified feature space for an individual group relative to other patterns in the individual group. In an embodiment, the specified feature space is a target mask image feature space, a frequency map feature space, a pattern density map feature space, a pattern occurrence feature space, an SGM feature space, a diffraction order feature space, or a diffraction pattern feature space.

In an embodiment, the method further comprises providing the training pattern to a deep convolutional neural network to train the deep convolutional neural network. In an embodiment, the method further comprises performing optical proximity correction as part of a wafer patterning process using the trained deep convolutional neural network.

According to another embodiment, there is provided a computer program product comprising a non-transitory computer readable medium having instructions recorded thereon, the instructions when executed by a computer implementing the method described above.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figure 1:
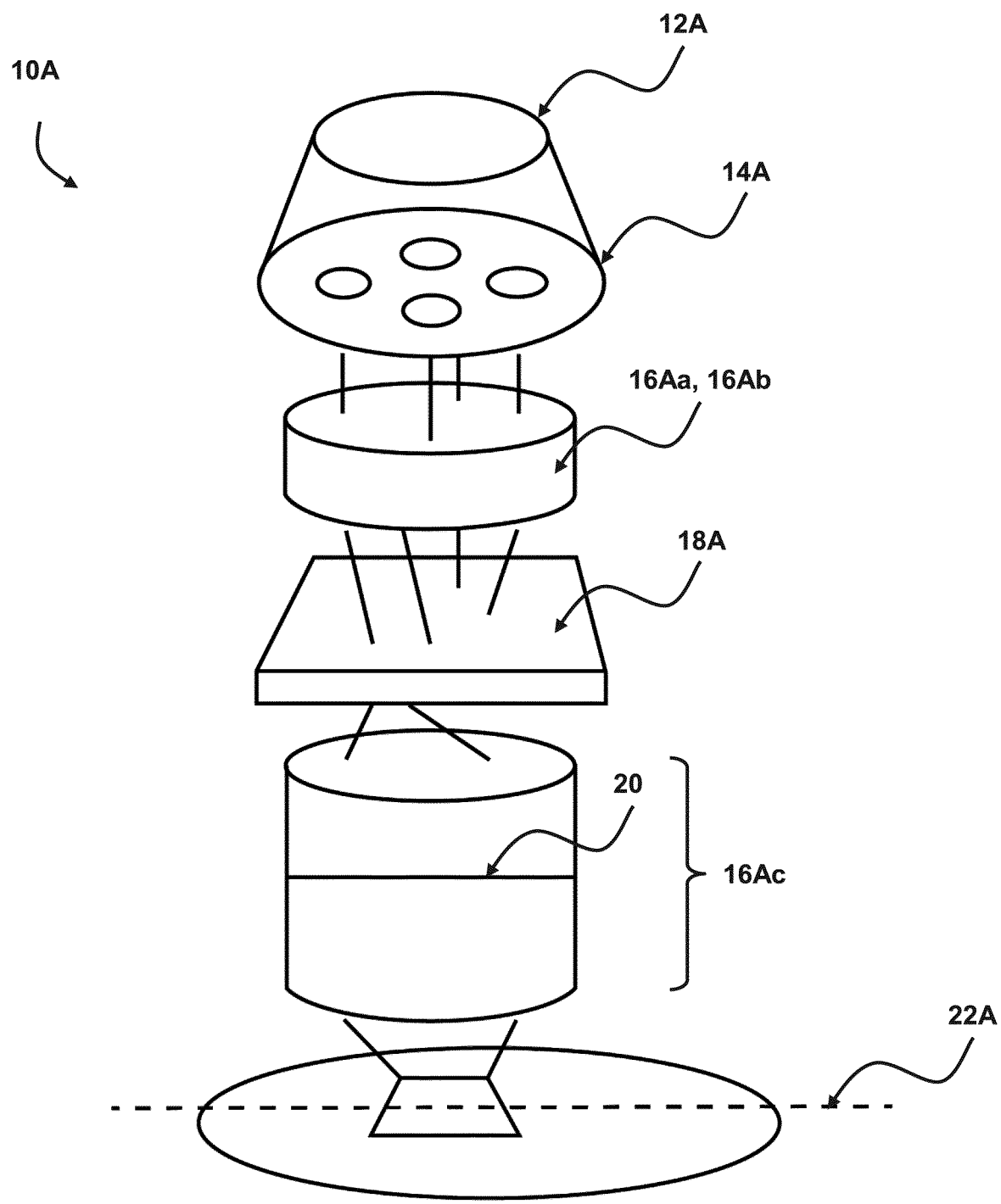
FIG. 1 shows a block diagram of various subsystems of a lithography system, according to an embodiment.

Performing pattern selection from a full-chip graphic database system (GDS) file (e.g., a GDSII file) is a challenging task. Training patterns are used to train deep convolutional neural networks (DCNN) and/or other machine learning models that are part of full-chip optical proximity correction (OPC) applications, source mask optimization (SMO) applications, lithography manufacturability check (LMC) applications, and/or are used for other purposes. If a user generates a training pattern set with a less than fully representative, or otherwise insufficient, pattern for a layout pattern, and provides such training data to a machine learning model (e.g., a DCNN) for training, an accurate CTM map will not be predicted by the machine learning model (e.g., the DCNN) for the full-chip OPC application. An inaccurate CTM map results in lithography hotspots and process window limitations, and/or causes difficulty during subsequent mask correction operations when trying to meet lithography performance specifications. Currently, users manually select a training pattern from a full-chip GDS. Manual selection requires significant work by the user, and layout pattern selections (e.g., representative coverage of the various patterns) are dependent on user's experience and prior knowledge on the full-chip GDS design. Advantageously, the present method and apparatus systematically analyzes full-chip GDS patterns and selects representative patterns to construct a machine learning model training set, with pattern-coverage adequately representative of target layout patterns across a full-chip GDS file.

As a brief introduction, although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. In these alternative applications, the skilled artisan will appreciate that, in the context of such alternative applications, any use of the terms "reticle", "wafer" or "die" in this text should be considered as interchangeable with the more general terms "mask", "substrate" and "target portion", respectively. In addition, it should be noted that the method described herein may have many other possible applications in diverse fields such as language processing systems, self-driving cars, medical imaging and diagnosis, semantic segmentation, denoising, chip design, electronic design automation, etc. The present method may be applied in any fields where quantifying uncertainty in machine learning model predictions is advantageous.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

A patterning device may comprise, or may form, one or more design layouts. The design layout may be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

FIG. 1 illustrates an exemplary lithographic projection apparatus 10A. Major components are a radiation source 12A, which may be a deep-ultraviolet (DUV) excimer laser source or other type of source including an extreme ultra violet (EUV) source (as discussed herein, the lithographic projection apparatus itself need not have the radiation source), illumination optics which, for example, define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin ($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply optical proximity correction (OPC) using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

Optical proximity correction (OPC) enhances an integrated circuit patterning process by compensating for distortions that occur during processing. The distortions occur during processing because features printed on a wafer are smaller than the wavelengths of light used in the patterning and printing process. OPC verification identifies OPC errors or weak points in a post-OPC wafer design that could potentially lead to patterning defects on the wafer. ASML Tachyon Lithography Manufacturability Check (LMC) is an OPC verification product, for example.

OPC addresses the fact that the final size and placement of an image of the design layout projected on the substrate will not be identical to, or simply depend only on the size and placement of the design layout on the patterning device. In the context of resolution enhancement techniques (RET) such as OPC, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to increase the chance that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design, almost every feature of the design layout has some modification in order to achieve high fidelity of the projected image to the target design. These modifications may include shifting or biasing of edge positions or line widths as well as application of "assist" features that are intended to assist projection of other features.

One of the simplest forms of OPC is selective bias. Given a CD vs. pitch curve, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD versus pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends tend to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of integrated circuit design and manufacturing is to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the design layout. The terms "main feature" and "assist feature" do not imply that a particular feature on a patterning device must be labeled as one or the other.

Another aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
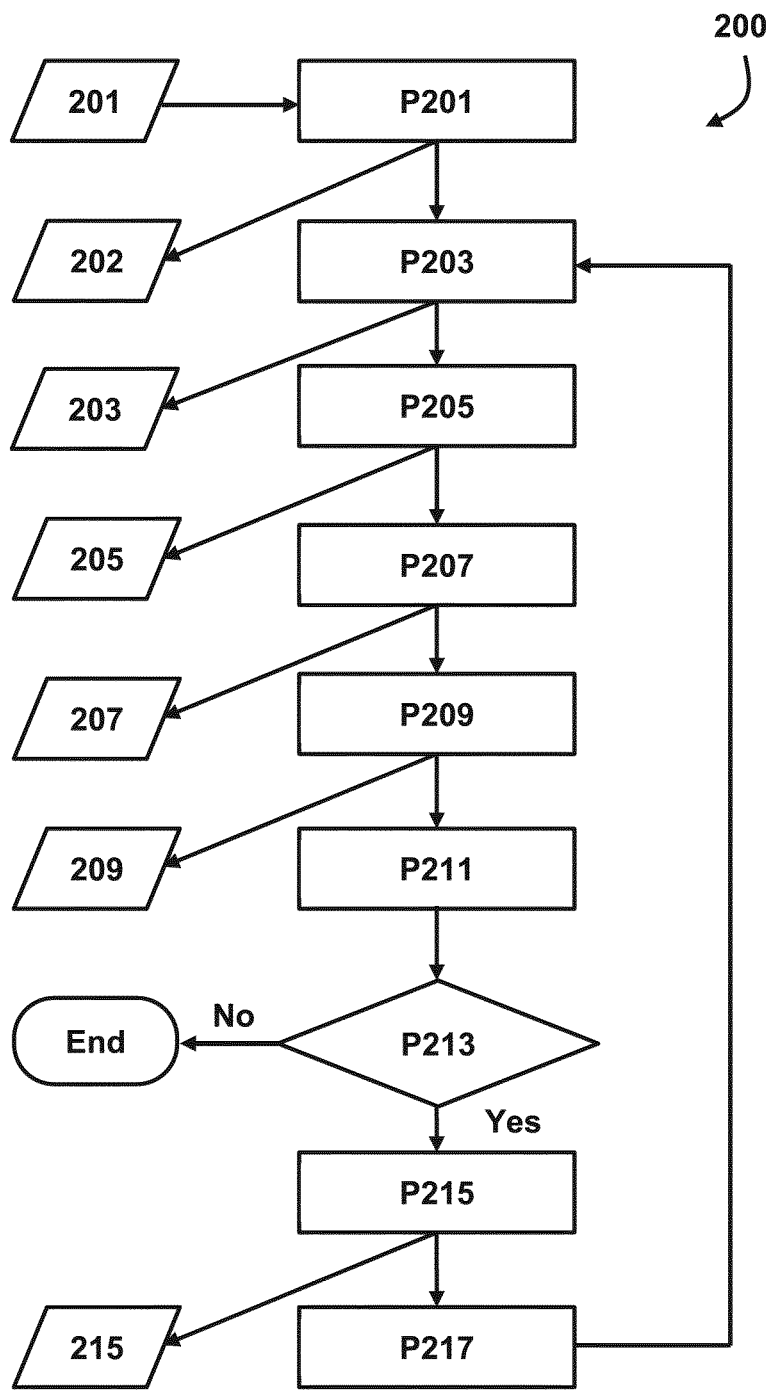
FIG. 2 is flow chart of a method for determining a patterning device pattern (or mask pattern) from an image (e.g., continuous transmission mask image, a binary mask image, a curvilinear mask image, etc.) corresponding to a target pattern to be printed on a substrate via a patterning process involving a lithographic process, according to an embodiment.

FIG. 2 is flow chart of a method 200 for determining a patterning device pattern (or mask pattern, hereinafter) from an image (e.g., continuous transmission mask image, a binary mask image, a curvilinear mask image, etc.) corresponding to a target pattern to be printed on a substrate via a patterning process involving a lithographic process. In an embodiment, the design layout or the target pattern may be a binary design layout, a continuous tone design layout, or a design layout of another suitable form.

The method 200 is an iterative process, where an initial image (e.g., enhanced image, mask variables initialized from a CTM image, etc.) is progressively modified to generate different types of images according to different processes of the present disclosure to eventually generate information comprising mask patterns or an image (e.g., a mask variable corresponding to a final curvilinear mask) further used to fabricate/manufacture a mask. The iterative modification of the initial image may be based on a cost function, where during an iteration the initial image may be modified such that the cost function is reduced, in an embodiment, minimized. In an embodiment, the method 200 may also be referred to as a BINARIZED CTM process, where an initial image is an optimized CTM image which is further processed according to the present disclosure to generate a curvilinear mask patterns (e.g., geometry or polygonal representation shapes of a curvilinear mask or curvilinear pattern). In an embodiment, the initial image may be the enhanced image of the CTM image). The curvilinear mask patterns may be in the form of a vector, a table, mathematical equations, or other forms of representing geometric/polygonal shapes.

In an embodiment, process P201 may involve obtaining an initial image (e.g., a CTM image or an optimized CTM image, or a binary mask image). In an embodiment, initial image 201 may be a CTM image generated by a CTM generation process based on a target pattern to be printed on a substrate. The CTM image may then be received by the process P201. In an embodiment, the process P201 may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model (e.g., Tachyon model) is applied to obtain optical or resist images and cost functions are computed. The cost computation then gives the gradient values that are used in the optimization solver to update variables (e.g., pixel intensities). After several iterations during optimization, a final mask image is generated, which is further used as guidance map for pattern extraction (e.g., as implemented in Tachyon SMO software). Such an initial image (e.g., the CTM image) may include one or more features (e.g., a feature of a target pattern, SRAFs, SRIFs, etc.) corresponding to the target pattern to be printed on the substrate via the patterning process.

In an embodiment, the CTM image (or an enhanced version of the CTM image) may be used to initialize the mask variables that can be used as the initial image 201, which is iteratively modified as discussed below.

The process P201 may involve generating an enhanced image 202 based on the initial image 201. An enhanced image 202 may be an image where certain selected pixels within the initial image 201 are amplified. The selected pixels may be pixels having relatively lower values (or weak signals) within the initial image 201. In an embodiment, the selected pixels be pixels have signal values lower than, for example, an average intensity of pixels throughout the initial image, or a given threshold value. In other words, pixels with weaker signals within the initial image 201 are amplified, thus enhancing one or more features within the initial image 201. For example, a second order SRAFs around a target feature may have a weak signal that may be amplified. Thus, the enhanced image 202 may highlight or identify additional features (or structures) that may be included within a mask image (generated later on in the method). In a conventional method (e.g., CTM method) of determining a mask image, weak signals within an initial image may be ignored and as such, the mask image may not include features that may be formed from a weak signal in an initial image 201.

The generation of the enhanced image 202 involves applying an image processing operation such as a filter (e.g., an edge detection filter) to amplify weak signals within the initial image 201. Alternatively, or in addition, the image processing operation may be deblurring, averaging, and/or feature extraction or other similar operations. Examples of the edge detection filter include the Prewitt operator, Laplacian operator, Laplacian of Gaussian (LoG) filter, etc. The generation step may further involve combining the amplified signals of the initial image 201 with original signals of the initial image 201 with or without modifying the original strong signals of the initial image 201. For example, in an embodiment, for one or more pixel values at one or more locations (e.g., at contact holes) across the initial image 201, the original signal may be relatively strong (e.g., above a certain threshold such as 150 or below −50), then the original signal at the one or more locations (e.g., at contact holes) may not be modified or combined with the amplified signal for that location.

In an embodiment, noise (e.g., random variation in brightness or color or pixel values) in the initial image 201 may also be amplified. So, alternatively or in addition, a smoothing process may be applied to reduce noise (e.g., random variation in brightness or color or pixel values) in the combined image. Examples of image smoothing methods include Gaussian blur, running average, low-pass filters, etc.

In an embodiment, the enhanced image 202 may be generated using an edge detection filter. For example, an edge detection filter may be applied to the initial image 201 to generate a filtered image that highlights edges of one or more features within an initial image 201. The resulting filtered image may be further combined with the original image (i.e., the initial image 201) to generate the enhanced image 202. In an embodiment, the combining of the initial image 201 and the image obtained after edge filtering may involve modifying only those parts of the initial image 201 that have weak signals without modifying the regions having strong signals, and the combining process could be weighted based on signal strength. In an embodiment, amplifying of the weak signal may also amplify noise within the filtered image. Hence, according to an embodiment, a smoothing process may be performed on the combined image. A smoothing of an image may refer to an approximating function that attempts to capture important patterns (e.g., target pattern, SRAFs) in the image, while leaving out noise or other fine-scale structures/rapid phenomena. In smoothing, the data points of a signal may be modified so individual points (presumably because of noise) may be reduced, and points that may be lower than the adjacent points may be increased leading to a smoother signal or a smoother image. Thus, upon smoothing operation, the further smooth version of the enhanced image 202 having reduced noise may be obtained, according to an embodiment of the present disclosure.

The method, in process P203 may involve generating mask variables 203 based on the enhanced image 202. In a first iteration, the enhanced image 202 may be used to initialize the mask variables 203. In later iterations the mask variables 203 may be updated iteratively.

A contour extraction of a real-valued function $f$ of n real variables, is a set of the form:

$$L_c = (f) = \{(x_1, x_2, \ldots x_n) | f(x_1, x_2, \ldots x_n) = c\}$$

In a two dimensional space, the set defines the points on the surface at which the function $f$ equals to given value c. In a two dimensional space, the function $f$ is able to extract a closed contour which will be rendered to the mask image.

In the above equation, $x_1, x_2, \ldots x_n$ refer to mask variables such as the intensity of an individual pixel, which determines the locations where the curvilinear mask edge exists with a given constant value c (e.g. a threshold plane as discussed in process P205 below).

In an embodiment, at an iteration, the generating of the mask variables 203 may involve modifying one or more values of variables (e.g., pixel values at one or more locations) within the enhanced image 202 based on, for example, initialization conditions or a gradient map (which may be generated later on in the method). For example, the one or more pixel values may be increased or decreased. In other words, the amplitude of one or more signals within the enhanced image 202 may be increased or decreased. Such modified amplitude of the signals enables generation of different curvilinear patterns depending on an amount of change in the amplitude of the signal. Thus, the curvilinear patterns gradually evolve until a cost function is reduced, in an embodiment, minimized. In an embodiment, further smoothing may be performed on the level mask variables 203.

Furthermore, process P205 involves generating curvilinear mask patterns 205 (e.g., having polygon shapes represented in a vector form) based on the mask variables 203. The generation of the curvilinear mask patterns 205 may involve thresholding of the mask variables 203 to trace or generate curvilinear (or curved) patterns from the mask variables 203. For example, thresholding may be performed using a threshold plane (e.g., an x-y plane) having a fixed value which intersects the signals of the mask variables 203. The intersection of the threshold plane with the signals of the mask variables 203 generate tracings or outlines (i.e., curved polygon shapes) which form polygonal shapes that serve as the curvilinear patterns for the curvilinear mask patterns 205. For example, the mask variables 203 may be intersected with the zero plane parallel to the (x,y) plane. Thus, the curvilinear mask patterns 205 may be any curvilinear patterns generated as above. In an embodiment, the curvilinear patterns traced or generated from the mask variables 203 depend on the signals of the enhanced image 202. As such, the image enhancement process P203 facilitates improvement in patterns generated for a final curvilinear mask pattern. The final curvilinear mask patterns may be further used by a mask manufacturer to fabricate a mask for use in a lithography process.

Process P207 may involve rendering the curvilinear mask patterns 205 to generate a mask image 207. Rendering is an operation performed on the curvilinear mask patterns, which is a similar process as converting rectangle mask polygons into discrete grayscale image representations. Such a process could be generally understood as sampling the box function of continuous coordinates (polygons) into values at each point of image pixels.

The method further involves a forward simulation of the patterning process using process models that generate or predict a pattern 209 that may be printed on a substrate based on the mask image 207. For example, process P209 may involve executing and/or simulating the process model using the mask image 207 as input and generating a process image 209 on the substrate (e.g., an aerial image, a resist image, etch image, etc.). In an embodiment, the process model may include a mask transmission model coupled to an optics model which is further coupled to a resist model and/or etch model (e.g., as described below). The output of the process model may be a process image 209 that has factored in different process variations during the simulation process. The process image may be further used to determine parameters (e.g., EPE, CD, overlay, sidelobe, etc.) of the patterning process by, for example, tracing the contours of the patterns within the process image. The parameters may be further used to define a cost function, which is further used to optimize the mask image 207 such that the cost function is reduced, or in an embodiment minimized.

In process P211, a cost function may be evaluated based on the process model image 209 (also referred as a simulated substrate image or substrate image or wafer image). Thus, the cost function may be considered as process aware, where variations of the patterning process, enabling generation of curvilinear mask patterns that account for variations in patterning process. For example, the cost function may be an edge placement error (EPE), sidelobe, a mean squared error (MSE), Pattern placement error(PPE), normalized image log or other appropriate variable defined based on the contour of the patterns in the process image. An EPE may be an edge placement error associated with one or more patterns and/or a summation of all the edge placement errors related to all the patterns of the process model image 209 and the corresponding target patterns. In an embodiment, the cost function may include more than one condition that may be simultaneously reduced or minimized For example, in addition to the MRC violation probability, the number of defects, EPE, overlay, CD or other parameter may be included, and all the conditions may be simultaneously reduced (or minimized).

Furthermore, one or more gradient maps may be generated based on the cost function (e.g., EPE) and mask variables may be modified based on such gradient map(s). Mask variables (MV) refer to intensities of 0. Accordingly, the gradient computation may be represented as dEPE/dØ, and the gradient values are updated by capturing the inverse mathematical relationship from the mask image (MI) to curvilinear mask polygons to mask variables. Thus, a chain of derivatives may be computed of the cost function with respect to the mask image, from the mask image to curvilinear mask polygon, and from curvilinear mask polygon to mask variables, which allows modification of the values of the mask variables at the mask variables.

In an embodiment, image regularization may be added to reduce the complexity of the mask patterns that may be generated. Such image regularization may be mask rule checks (MRC). MRC refers to the limiting conditions of a mask manufacturing process or apparatus. Thus, the cost function may include different components, for example, based on EPE and MRC violation penalty. A penalty may be a term of the cost function that depends on a violation amount, e.g., a difference between a mask measurement and a given MRC or mask parameter (for example, a mask pattern width and an allowed (e.g., minimum or maximum) mask pattern width). Thus, according to an embodiment of the present disclosure, mask patterns may be designed, and a corresponding mask may be fabricated not only based on forward simulation of the patterning process, but also additionally based on manufacturing limitations of the mask manufacturing apparatus/process. Thus, a manufacturable curvilinear mask producing high yield (i.e., minimum defects) and high accuracy in terms of, for example, EPE or overlay on the printed pattern may be obtained.

The pattern corresponding to a process image should be exactly the same as the target pattern, however, such exact target patterns may not feasible (for example, typically sharp corners) and some conflictions are introduced due to the variations in the patterning process itself and/or approximations in the models of the patterning process. In a first iteration of the method, the mask image 207 may not generate a pattern (in the resist image) which is similar to the target pattern. The determination of accuracy or acceptance of the printed pattern in the resist image (or etch image) may be based on the cost function such as EPE. For example, if the EPE of the resist pattern is high, it indicates that the printed pattern using the mask image 207 is not acceptable and patterns in the mask variable 203 must be modified.

To determine whether a mask image 207 is acceptable, process P213 may involve determining whether the cost function is reduced or minimized, or whether a given iteration number is reached. For example, an EPE value of a previous iteration may be compared with an EPE value of the current iteration to determine whether the EPE has reduced, minimized, or converged (i.e., no substantial improvement in printed pattern is observed). When the cost function is minimized, the method may stop and the curvilinear mask patterns information that is generated is considered as an optimized result.

However, if the cost function is not reduced or minimized, and the mask related variables or enhanced image related variable (e.g., pixel values) may be updated. In an embodiment, the updating may be based on gradient-based method. For example, if the cost function is not reduced, the method 200 proceeds to a next iteration of generating the mask image after performing processes P215 and P217 that indicate how to further modify the mask variables 203

The process P215 may involve generating a gradient map 215 based on the cost function. The gradient map may be a derivative and/or a partial derivative of the cost function. In an embodiment the partial derivative of the cost function may be determined with respect pixels of the mask image and derivative may be further chained to determine partial derivative with respect to the mask variables 203. Such gradient computation may involve determining inverse relationships between the mask image 207 to the mask variables 203. Furthermore, an inverse relationship of any smoothing operation (or function) performed in process P205 and P203 must be considered.

The gradient map 215 may provide a recommendation about increasing or decreasing the values of the mask variables in a manner such that value of the cost function is reduced, in an embodiment, minimized. In an embodiment, an optimization algorithm may be applied to the gradient map 215 to determine the mask variable values. In an embodiment, an optimization solver may be used to perform gradient-based computation (in process P217).

In an embodiment, for an iteration, mask variables may be changed while the threshold plane may remain fixed or unchanged in order to gradually reduce or minimize the cost function. Thus, the curvilinear patterns generated may gradually evolve during an iteration such that the cost function is reduced, or in an embodiment, minimized. In another embodiment, mask variables as well as the threshold plane may both change to achieve faster convergence of the optimization process. Upon several iterations and/or minimization of the cost function may result in final set of BINARIZED CTM results (i.e., a modified version of the enhanced image, mask image, or curvilinear mask).

In an embodiment of the present disclosure, the transition from CTM optimization with grayscale image to BINARIZED CTM optimization with curvilinear mask may be simplified by replacing the thresholding process (i.e. P203 and P205) by a different process where a sigmoid transformation is applied to the enhanced image 202 and corresponding change in gradient computation is performed. The sigmoid transformation of the enhanced image 202 generates a transformed image that gradually evolve into a curvilinear pattern during an optimization process (e.g., minimizing cost function). During an iteration or a step of optimization, variables (e.g., steepness and/or a threshold) related to sigmoid function may be modified based on the gradient computation. As the sigmoid transformation becomes sharper (e.g., increase in steepness of the slope of the sigmoid transformation) in successive iterations, a gradual transition from the CTM image to a final BINARIZED CTM image may be achieved allowing improved results in the final BINARIZED CTM optimization with curvilinear mask patterns.

In an embodiment of the present disclosure, additional steps/process may be inserted into the loop of an iteration of the optimization, to enforce the result to have selected or desired properties. For example, smoothness may be ensured by adding a smoothing step, or other filter may be used to enforce image to favor horizontal/vertical structures.

The present method has several features or aspects. For example, using an optimized CTM mask image with image enhancement methods to improve the signal which may be further used as seeding in an optimization flow. In another aspect, use of the thresholding method with the CTM technique (referred to as BINARIZED CTM) enables generation of curvilinear mask patterns. In yet another aspect, a full formulation (i.e., a closed loop formulation) of gradient computation also allows using a gradient-based solver for mask variable optimization. The BINARIZED CTM results may be used as a local solution (as hotspot repair) or used as a full chip solution. The BINARIZED CTM results may be used together with machine learning as input. This may allow the use of machine learning to speed up BINARIZED CTM. In yet another aspect, the method includes image regularization methods to improve the results. In another aspect, the method involves successive optimization stages to achieve more smooth transitions from grayscale image CTM to binary curvilinear mask BINARIZED CTM. The method allows tuning the threshold of optimization to improve results. The method includes additional transformation into an iteration of optimization to enforce good property of results (require smoothness in BINARIZED CTM image).

As lithography nodes keep shrinking, more and more complicated masks are required. The present method may be used in key layers with DUV scanners, EUV scanners, and/or other scanners. The method according to the present disclosure may be included in different aspects of the mask optimization process including source mask optimization (SMO), mask optimization, and/or OPC.

As described above, it is often desirable to be able computationally determine how a patterning process would produce a desired pattern on a substrate. Thus, simulations may be provided to simulate one or more parts of the process. For example, it is desirable to be able to simulate the lithography process of transferring the patterning device pattern onto a resist layer of a substrate as well as the yielded pattern in that resist layer after development of the resist.

Figure 3:
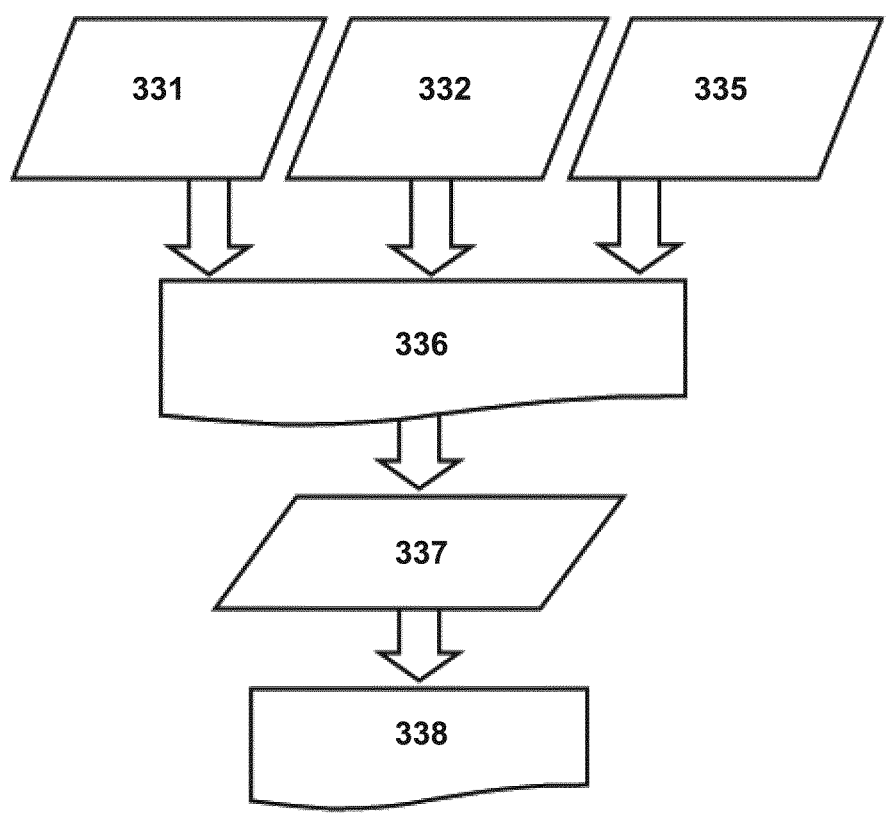
FIG. 3 illustrates an exemplary flow chart for simulating lithography in a lithographic projection apparatus, according to an embodiment.

An exemplary flow chart for simulating lithography in a lithographic projection apparatus is illustrated in FIG. 3. An illumination model 331 represents optical characteristics (including radiation intensity distribution and/or phase distribution) of the illumination. A projection optics model 332 represents optical characteristics (including changes to the radiation intensity distribution and/or the phase distribution caused by the projection optics) of the projection optics. A design layout model 335 represents optical characteristics (including changes to the radiation intensity distribution and/or the phase distribution caused by a given design layout) of a design layout, which is the representation of an arrangement of features on or formed by a patterning device. An aerial image 336 can be simulated using the illumination model 331, the projection optics model 332, and the design layout model 335. A resist image 338 can be simulated from the aerial image 336 using a resist model 337. Simulation of lithography can, for example, predict contours and/or CDs in the resist image.

More specifically, illumination model 331 can represent the optical characteristics of the illumination that include, but are not limited to, NA-sigma ($\sigma$) settings as well as any particular illumination shape (e.g. off-axis illumination such as annular, quadrupole, dipole, etc.). The projection optics model 332 can represent the optical characteristics of the of the projection optics, including, for example, aberration, distortion, a refractive index, a physical size or dimension, etc. The design layout model 335 can also represent one or more physical properties of a physical patterning device, as described, for example, in U.S. Pat. No. 7,587,704, which is incorporated by reference in its entirety. Optical properties associated with the lithographic projection apparatus (e.g., properties of the illumination, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the illumination and the projection optics (hence design layout model 335).

The resist model 337 can be used to calculate the resist image from the aerial image, an example of which can be found in U.S. Pat. No. 8,200,468, which is hereby incorporated by reference in its entirety. The resist model is typically related to properties of the resist layer (e.g., effects of chemical processes which occur during exposure, post-exposure bake and/or development).

The objective of the simulation is to accurately predict, for example, edge placements, aerial image intensity slopes and/or CDs, which can then be compared against an intended design. The intended design is generally defined as a pre-OPC design layout which can be provided in a standardized digital file format such as GDSII, OASIS or another file format.

From the design layout, one or more portions may be identified, which are referred to as "clips". In an embodiment, a set of clips is extracted, which represents the complicated patterns (e.g., a pattern set) in the design layout (typically about 50 to 1000 clips, although any number of clips may be used). As will be appreciated by those skilled in the art, these patterns or clips represent small portions (e.g., circuits, cells, etc.) of the design for which particular attention and/or verification is needed (e.g., the pattern set). In other words, clips may be the portions of the design layout or may be similar or have a similar behavior of portions of the design layout where critical features are identified either by experience (including clips provided by a customer), by trial and error, or by running a full-chip simulation. Clips often contain one or more test patterns or gauge patterns. An initial larger set of clips may be provided a priori by a customer based on known critical feature areas in a design layout which require particular image optimization. Alternatively, in another embodiment, the initial larger set of clips may be extracted from the entire design layout by using the process described below that identifies the critical feature areas.

In some examples, the simulation and modeling can be used to configure one or more features of the patterning device pattern (e.g., performing optical proximity correction), one or more features of the illumination (e.g., changing one or more characteristics of a spatial/angular intensity distribution of the illumination, such as change a shape), and/or one or more features of the projection optics (e.g., numerical aperture, etc.). Such configuration can be generally referred to as, respectively, mask optimization, source optimization, and projection optimization. Such optimization can be performed on their own, or combined in different combinations. One such example is source-mask optimization (SMO), which involves the configuring of one or more features of the patterning device pattern together with one or more features of the illumination. The optimization techniques may focus on one or more of the clips. The optimizations may use the machine learning model described herein to predict values of various parameters (including images, etc.).

In some embodiments, illumination model 331, projection optics model 332, design layout model 335, resist model 337, an SMO model, and/or other models associated with and/or included in an integrated circuit manufacturing process may be an empirical model that performs the operations of the method described herein. The empirical model may predict outputs based on correlations between various inputs (e.g., one or more characteristics of a mask or wafer image, one or more characteristics of a design layout, one or more characteristics of the patterning device, one or more characteristics of the illumination used in the lithographic process such as the wavelength, etc.).

As an example, the empirical model may be a machine learning model. In some embodiments, the machine learning model may be and/or include mathematical equations, algorithms, plots, charts, networks (e.g., neural networks), and/or other tools and machine learning model components. For example, the machine learning model may be and/or include one or more neural networks having an input layer, an output layer, and one or more intermediate or hidden layers. In some embodiments, the one or more neural networks may be and/or include deep neural networks (e.g., neural networks that have one or more intermediate or hidden layers between the input and output layers).

As an example, the one or more neural networks may be based on a large collection of neural units (or artificial neurons). The one or more neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In some embodiments, each individual neural unit may have a summation function that combines the values of all its inputs together. In some embodiments, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the one or more neural networks may include multiple layers (e.g., where a signal path traverses from front layers to back layers). In some embodiments, back propagation techniques may be utilized by the neural networks, where forward stimulation is used to reset weights on the "front" neural units. In some embodiments, stimulation and inhibition for the one or more neural networks may be more free flowing, with connections interacting in a more chaotic and complex fashion. In some embodiments, the intermediate layers of the one or more neural networks include one or more convolutional layers, one or more recurrent layers, and/or other layers.

The one or more neural networks may be trained (i.e., whose parameters are determined) using a set of training data. The training data may include a set of training samples. Each sample may be a pair comprising an input object (typically a vector, which may be called a feature vector) and a desired output value (also called the supervisory signal). A training algorithm analyzes the training data and adjusts the behavior of the neural network by adjusting the parameters (e.g., weights of one or more layers) of the neural network based on the training data. For example, given a set of N training samples of the form $\{(x_1,y_1), (x_2,y_2), \ldots, (x_N,y_N)\}$ such that $x_i$ is the feature vector of the i-th example and $y_i$ is its supervisory signal, a training algorithm seeks a neural network $g:X \rightarrow Y$, where X is the input space and Y is the output space. A feature vector is an n-dimensional vector of numerical features that represent some object (e.g., a wafer design as in the example above). The vector space associated with these vectors is often called the feature space. After training, the neural network may be used for making predictions using new samples.

As described above, to train a DCNN and/or other machine learning models to predict a CTM map, for example, a user is required to generate CTM images as training data (e.g., via the ASML Tachyon product). However, selecting appropriate representative portions of the patterns in a full-chip GDS as a training pattern set to train the DCNN to predict the CTM map is difficult. Manual selection requires a user to have significant pre-knowledge about the full-chip GDS design, and to devote many hours of time to the selection process. Although random selection is not as time consuming relative to manual selection, the uncertain pattern coverage and low stability associated with random selection makes random selection non-viable in real world applications.

To address these and other disadvantages of prior systems, the present method and apparatus provide users an effective tool to automatically perform training pattern selection from full-chip GDS files. The present method and apparatus are configured to automatically select representative patterns from a pattern set, in less time compared to prior art systems.

Figure 4:
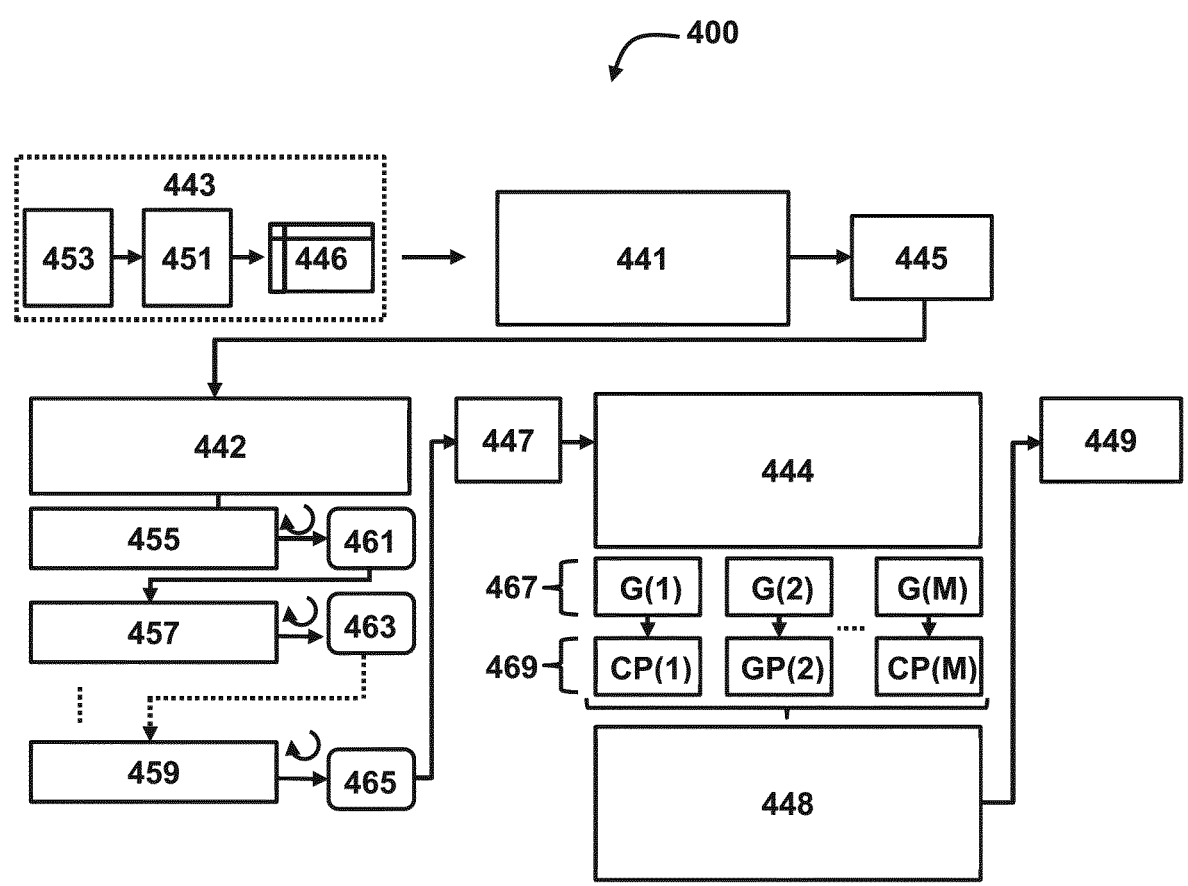
FIG. 4 illustrates a summary of operations of the present method for determining a training pattern in a wafer patterning process, according to an embodiment.

FIG. 4 illustrates a summary of operations of the present method 400 for determining a training pattern in a wafer patterning process. The method shown in FIG. 4 is, or is part of, a method for training a machine learning model in a wafer patterning process (e.g., as described herein). The operations include generating 441 (e.g., with a feature generation engine) a plurality of features from unique patterns in a pattern set 443 to form an enhanced pattern set with additional features 445; grouping 442 (e.g., with a pattern clustering engine) the patterns in the enhanced pattern set 445 into individual groups 447 based on similarities in the plurality of generated features; and selecting 444 (e.g., with a pattern selection engine) representative patterns 448 from the individual groups 447 to determine the training pattern 449. The selected representative patterns 448 (e.g., that form training pattern 449) from the individual groups 447 may be provided to a machine learning model (e.g., a DCNN—not shown in FIG. 4) to train the machine learning model to predict a continuous transmission mask (CTM) map for optical proximity correction (OPC) in the wafer patterning process, and/or may be provided for other applications. The patterns in pattern set 443 may be, and/or be part of, a unique pattern library 446 generated by a pattern collector from layout (PCL) function in a Tachyon PRO (pattern recognition and optimization) product, for example, (and/or other similar products) 451 based on a full chip layout GDS file 453, for example.

In operation 441, the plurality of generated features comprises geometrical features, lithography aware features, and/or other features. The geometrical features comprise one or more of target mask images, frequency maps, pattern density maps, pattern occurrences of the unique patterns in the pattern set, and/or other geometrical features. The lithography aware features comprise one or more of sub-resolution assist feature guidance maps (SGM), diffraction orders, diffraction patterns of the unique patterns in the pattern set, and/or other lithography aware features. Geometrical features and lithography aware features are generated for each of the patterns in the pattern set. In an embodiment, a set of features (including geometrical and/or lithography aware features) is generated for each pattern (in set 443). The plurality of features generated from the patterns in the pattern set are in addition to geometrical information and/or vertex information already included in the pattern set.

For example, pattern set 446 (e.g., a pattern library (PLIB)) generated by PCL 451 may include contain geometrical information related to individual unique patterns. However, only vertex information for an individual pattern may be stored as part of pattern set 446 to represent a particular pattern design. Vertex information is easy to use for exact pattern matching, but vertex information is not sufficient to guide a pattern grouping method to sufficiently group similar patterns (that are not exactly the same), because such a process is a fuzzy matching process, for example. To improve the robustness of the pattern grouping in operation 442, operation 441 includes generating additional features for individual patterns (e.g., in addition to the vertex geometrical information), including both the geometrical and lithography aware features. As described above, the geometrical features comprise one or more of target mask images, frequency maps, pattern density maps, pattern occurrences of the unique patterns in the pattern set, and/or other geometrical features. The lithography aware features comprise one or more of sub-resolution assist feature guidance maps (SGM), diffraction orders, diffraction patterns of the unique patterns in the pattern set, and/or other lithography aware features. However, this description is not intended to be limiting. Operation 441 may be customized by a user to extend to additional and/or different features generated according to a user's specification.

Figure 5:
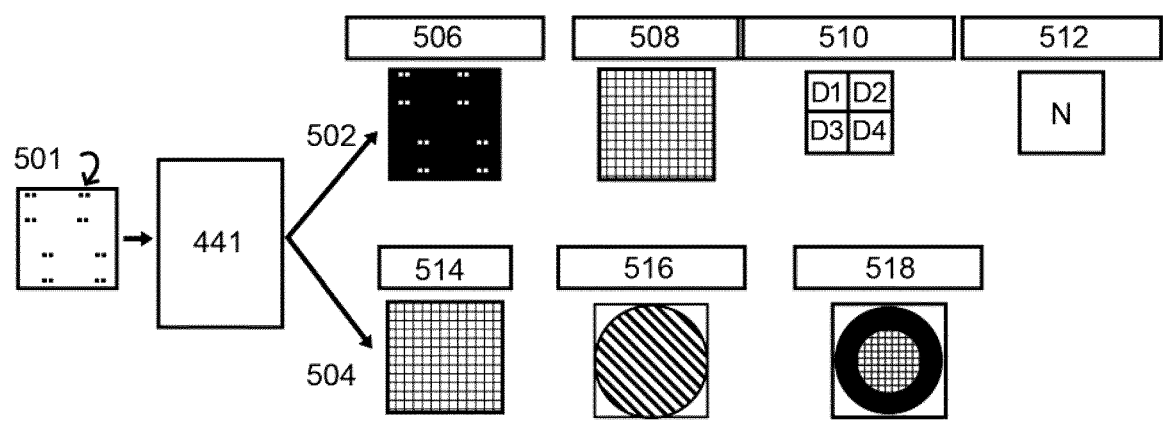
FIG. 5 illustrates aspects of feature generation, according to an embodiment.

FIG. 5 illustrates aspects of feature generation operation 441 shown in FIG. 4. As shown in FIG. 5, operation 441 includes generating geometrical features 502 and lithography aware features 504. Geometrical features 502 and lithography aware features 504 are generated for each of the patterns 501 in pattern set 443 (FIG. 4) such that a set of features 502, 504 is generated for each pattern 501. Examples of geometrical features 502 generated as part of operation 441 (e.g., by a feature generation engine) include a target mask image 506, a frequency map 508, a pattern density map 510, and a pattern occurrence (count) 512 of the patterns in the pattern set. Examples of lithography aware features 504 generated as part of operation 441 (e.g., by the feature generation engine) include an SGM map 514, a diffraction order 516, and a diffraction pattern 518. These features are examples only, and are not intended to be limiting.

Returning to FIG. 4, in operation 442, grouping the patterns in enhanced pattern set 445 into individual groups is based on similarities in the plurality of generated features (e.g., generated at operation 441). Operation 442 is performed using unsupervised machine learning. In an embodiment, the grouping comprises clustering and/or other grouping operations. The clustering comprises a sequential series of clustering steps 455, 457, 459 performed using different ones of the plurality of generated features for the different clustering steps 455, 457, 459. In the example shown in FIG. 4, clustering step 455 may be performed based on a first feature, clustering step 457 may be performed based on a second feature, and clustering step 459 (and/or any other intermediate clustering steps) may be performed based on an n-th feature. The sequential series of clustering steps 455, 457, 459 forms corresponding sub-groups 461, 463, 465 of the unique patterns in the pattern set such that the representative patterns 448 (operation 444) are selected from the sub-groups 461, 463, 465 to determine training pattern 449.

Figure 6:
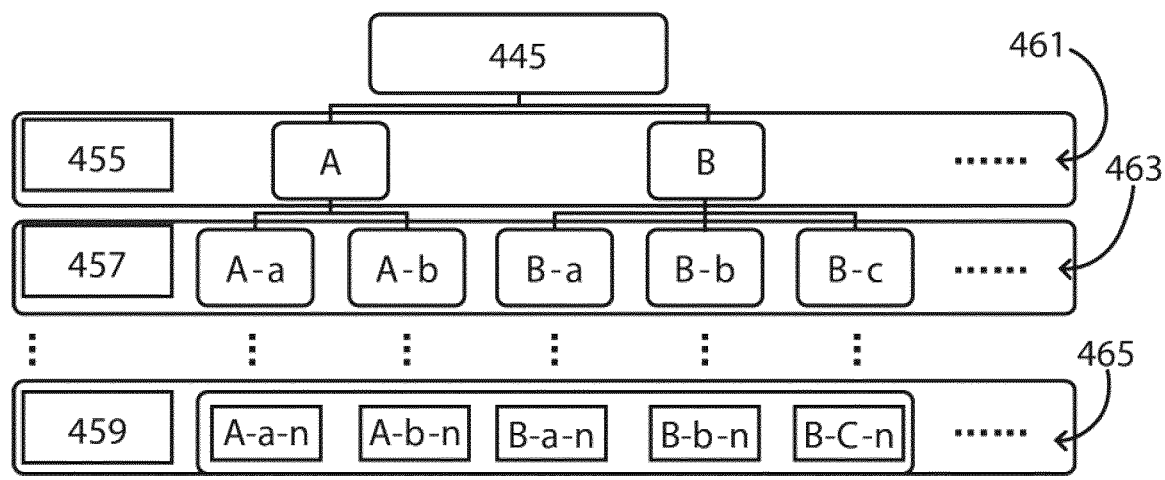
FIG. 6 illustrates clustering patterns in a pattern set into individual groups based on similarities in a plurality of features generated for the unique patterns, according to an embodiment.

FIG. 6 illustrates additional detail related to operation 442 shown in FIG. 4. For example, FIG. 6 illustrates clustering the patterns in enhanced pattern set 445 into individual groups based on similarities in the plurality of generated features (e.g., generated at operation 441 shown in FIG. 4—by a feature generation engine, for example). Since patterns exhibit multidimensional features, clustering may be executed based on individual features. The clustering shown in FIG. 6 may be performed by unsupervised machine learning on each pattern, considering multiple features for each pattern in a step-by-step manner to group the patterns that share similarity in multidimensional features together (e.g., to form branches and sub-branches of groups as shown in FIG. 6). A user may define which features should be used to cluster the patterns, and the sequence of features for clustering, for example. In the example shown in FIG. 6, the clustering comprises a sequential series of clustering steps 455, 457, 459 performed using different ones (e.g., whose identity and order were defined by a user) of the plurality of generated features for the different clustering steps 455, 457, 459. Clustering step 455 may be performed based on a first feature, clustering step 457 may be performed based on a second feature, and clustering step 459 (and/or any other intermediate clustering steps) may be performed based on an n-th feature, for example. The sequential series of clustering steps 455, 457, 459 forms corresponding sub-groups 461 (e.g., groups A and B), 463 (e.g., groups A-a, A-b, B-a, B-b, B-c), and 465 (e.g., A-a-n, A-b-n, B-a-n, B-b-n, B-c-n, etc.) of the unique patterns. Patterns in groups in the nth layer of the hierarchy shown in FIG. 6 (clustering step 459) share similarity in n kinds of features, for example.

In an embodiment, the sequential series of clustering steps 455, 457, 459 comprise cross validation steps performed using a given feature for a given step. The cross validation steps include adjusting how many groups are clustered at an individual clustering step 455, 457, 459, determining and/or adjusting which unique patterns are included in a given sub group, and/or other cross validation operations. In an embodiment, the cross validation steps include optimizing how many groups are clustered at an individual clustering step 455, 457, 459, and optimizing which unique patterns are included in a given sub group, and/or other cross validation operations.

In an embodiment, the clustering and/or cross validation comprises a machine learning clustering method such as k-means clustering and/or other clustering methods. K-means clustering is configured to partition n observations into k clusters in which each observation belongs to the cluster with the nearest mean, which serves as a representative example of the cluster. This results in a partitioning of the data space into Voronoi cells. Given a set of patterns $(x_1, x_2, \ldots, x_n)$ and one of its corresponding features, the feature may be treated as a d-dimensional real vector such that k-means clustering is configured to partition the n observations into k ($\leq$n) sets $S=\{S_1, S_2, \ldots, S_k\}$ to minimize the within-cluster sum of squares. Formally, the objective is to find:

$$\operatorname*{argmin}_{S} \sum_{i=1}^{k} \sum_{x \in S_i} \|x - \mu_i\|^2 = \operatorname*{argmin}_{S} \sum_{i=1}^{k} |S_i| \operatorname{Var} S_i$$

where $\mu_i$ is the mean of points in $S_i$.

Although k-means clustering is an efficient clustering method, one of its drawbacks is a requirement for a number of clusters, k, to be specified before the clustering occurs. In order to resolve the need for pre-selection of a number of clusters for each k-means clustering process, the present apparatus and method are configured to conduct a k-fold cross-validation check with an elbow method to determine a value (e.g., an optimal value) of k. The elbow method comprises running k-means clustering on a dataset for a range of values of k (e.g., k from 1 to 14—this is not intended to be limiting), and for each value of k, determine a sum of squared errors (SSE). After the SSE is determined, a line chart of the SSE is plotted for each value of k.

Figure 7:
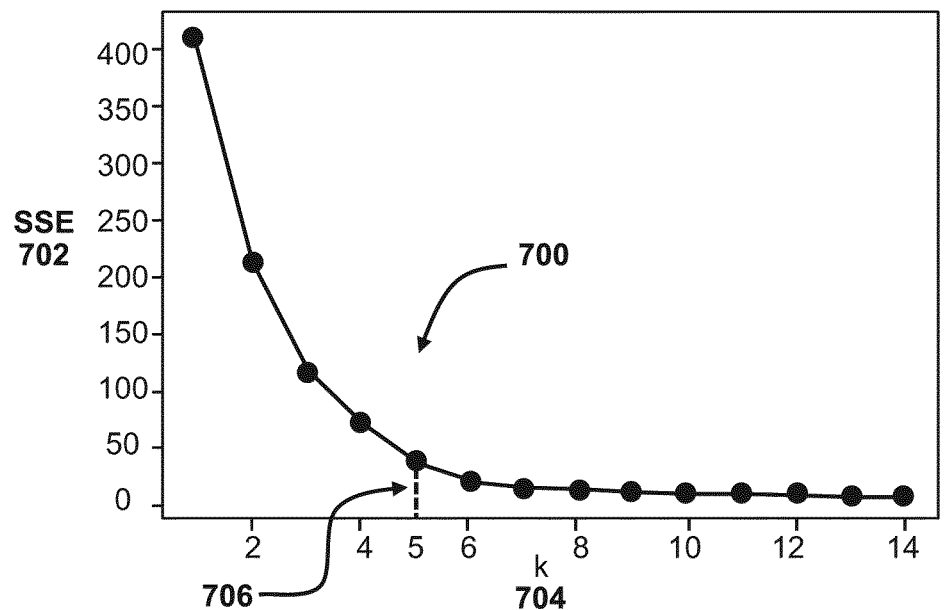
FIG. 7 illustrates an example plot of a sum of squared errors versus values of k that is part of a clustering validation operation, in accordance with an embodiment.

FIG. 7 illustrates an example line chart plot 700 of SSE 702 versus values of k 704. If line chart plot 700 looks like an arm, then the "elbow" 706 on the arm corresponds to an optimal value of k. In principle, a relatively small SSE is preferred, but the SSE tends to decrease toward zero as k increases (the SSE is 0 when k is equal to the number of data points in the dataset, because then each data point is its own cluster, and there is no error between it and the center of its cluster). The present method and apparatus are configured to determine a small value for k that still has a low SSE, and the "elbow" 706 in line chart plot 700 corresponds to a location in line chart plot 700 where increasing k produces diminishing returns. For example, in FIG. 7, "elbow" 706 is at k=5, indicating the optimal k for this example dataset is 5. As k is increased above 5, SSE 702 changes by less and less as it approaches zero.

The present method and apparatus are configured such that, for the determination of the sum of squared errors for each value of k, a k-fold cross-validation check is performed. In k-fold cross-validation, an original sample is randomly partitioned into p equal sized subsamples. Of the p subsamples, a single subsample is retained as validation data for determination of the sum of squared errors, and the remaining p−1 subsamples are used as training data for the K-means clustering. The cross-validation process is then repeated p times, with each of the p subsamples used exactly once as the validation data. The p results can then be averaged to produce a single estimation of the sum of squared errors. An advantage of this method over repeated random sub-sampling is that individual observations are used for both training and validation, and individual observations are used for validation exactly once.

Figure 8:
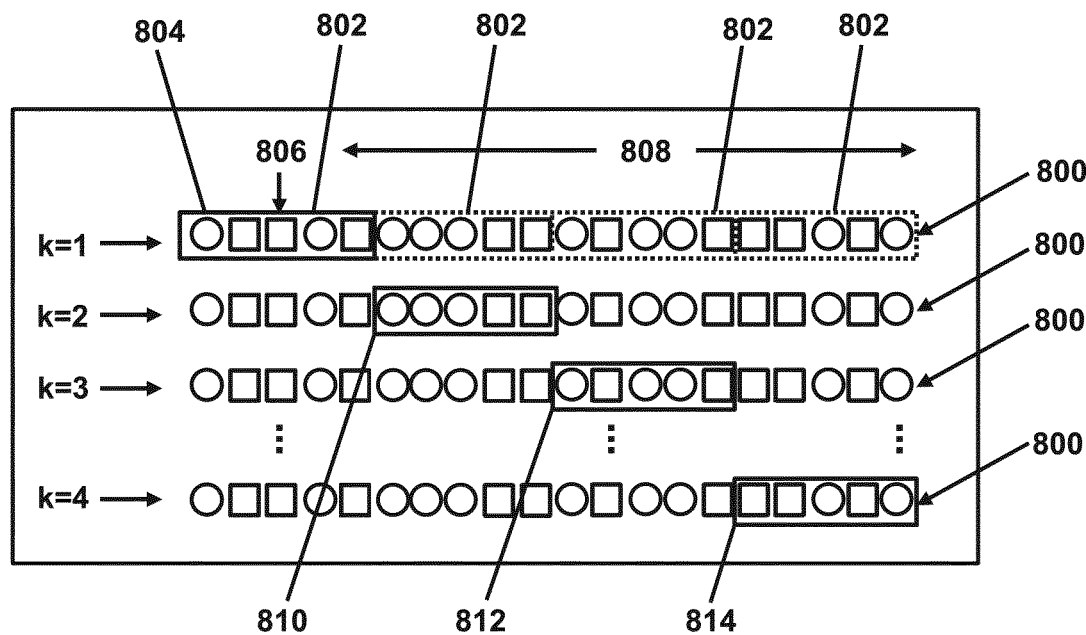
FIG. 8 illustrates a k-fold cross validation, in accordance with an embodiment.

By way of a non-limiting example, FIG. 8 illustrates a k-fold cross validation with k=4. As shown in FIG. 8, an original sample 800 is randomly partitioned into p equal sized subsamples 802 (e.g., five dots in each subsample 802). In FIG. 8, there are p=4 subsamples in sample 800. Of the p=4 subsamples, a single subsample 804 is retained as validation data 806 for determination of the sum of squared errors, and the remaining p−1 subsamples 802 are used as training data 808 for the K-means clustering. The cross-validation process is then repeated p times, with each of the p subsamples used exactly once as the validation data (e.g., 810, 812, 814). The p results can then be averaged to produce a single estimation of the sum of squared errors.

Returning to FIG. 4, selecting 444 representative patterns 448 from the individual groups 447 to determine training pattern 449 comprises selecting a target number ("M") 467 of representative patterns 448 from a corresponding number of groups 447 (e.g., groups G(I), G(2), G(M)). In an embodiment, selecting representative patterns 448 from the target number 467 of individual groups 447 to determine training pattern 449 comprises selecting a most central pattern 469 (CP(1), CP(2), CP(M) as shown in FIG. 4) from the target number 467 (G(I), G(2), G(M)) of individual groups 447.

In an embodiment, the most central pattern 469 from a given group (CP(1), CP(2), . . . , CP(M)) is the pattern closest to a centroid of a specified feature space for an individual group relative to other patterns in the individual group. For example, the specified feature space may be a target mask image feature space, a frequency map feature space, a pattern density map feature space, a pattern occurrence feature space, an SGM feature space, a diffraction order feature space, a diffraction pattern feature space, and/or other feature spaces. In an embodiment, the present method and apparatus may be configured such that, by default, the target mask image feature space is used to select the central sample. However, as each sample in the enhanced pattern set (e.g., 445 in FIG. 4) includes multidimensional features (e.g. frequency map, pattern density map, etc.), the present method and apparatus may be configured such that a user may specify a feature space and/or select a central sample based on a target feature accordingly.

The present method and apparatus are configured such that, assuming there are a total number (N) of individual groups 447, and responsive to N being larger than the target number M 467 of representative patterns 448, M patterns are selected from N groups as a representative example pattern set to use as training pattern 449. The M selected patterns are configured to maximize the variation in training pattern 449 in a given (e.g., user selected) feature space (e.g., the target mask image feature space by default).

Figure 9:
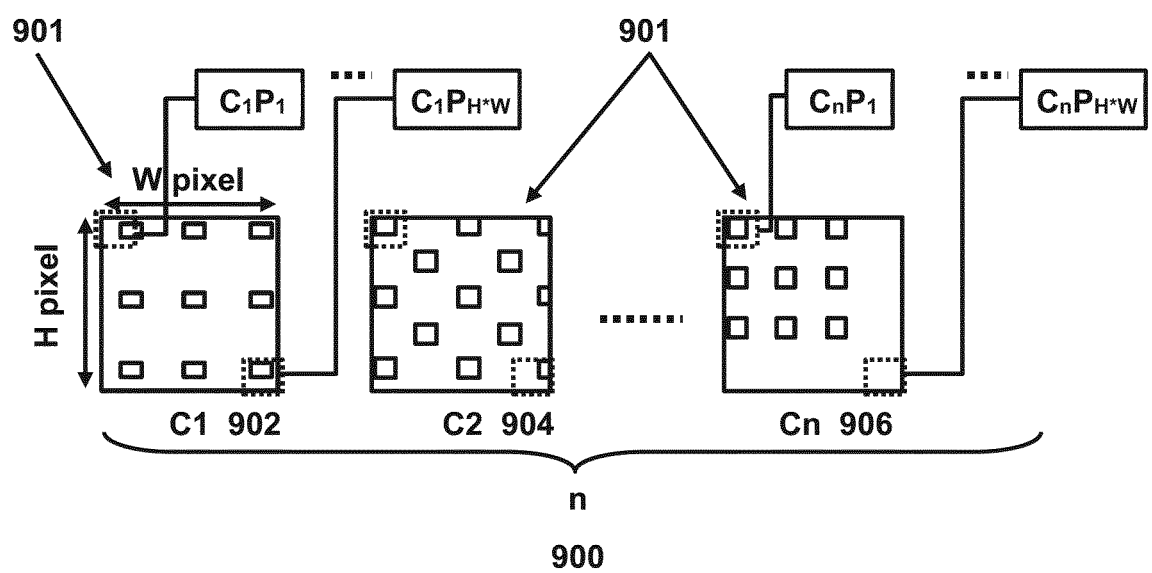
FIG. 9 illustrates pattern selection to form a representative example pattern set for use as a training pattern, in accordance with an embodiment.

FIG. 9 illustrates pattern selection from n groups 900 (e.g., "n" in FIG. 9 is similar to "N" described above) to form a representative example pattern set for use as a training pattern (e.g., 449 in FIG. 4). Groups 900 are formed by images 901 (e.g., clips) C1 902, C2 904, . . . , Cn 906. As shown in FIG. 9, for a pattern set including n samples (e.g., n images (or clips) of different patterns), with a sample image size of H pixels by W pixels (e.g., H×W), $C_j P_i$ indicates the i-th pixel in the j-th image (clip), where j∈[1,n], i∈[1,H*W]. For pixel $P_i$, the variation of $P_i$ along different images is given by:

$$v_i^2 = \frac{1}{n}\sum\nolimits_{j=1}^{j=n}(P_{ij} - \bar{P}_i)^2$$

For each term $(P_{ij}-P_i)^2$ in above formula, the variation of j-th pixel among n images of the same pixel position is determined, and the pixel variation of all H×W pixels is summed to represent the criterion to select M patterns from N groups as a representative example pattern set, with the selection criterion configured to maximize variation in the training pattern.

Returning to FIG. 4, as described above, the present method and apparatus are configured to select M samples from the N candidates (M<N) to maximize the variation of training pattern 449 (e.g., in the target mask image feature space). In an embodiment, determining training pattern 449 may include performing a global searching method across all N candidates such that training patter 449 has a maximum amount of variation. The global searching method comprises traversing all the permutations of candidate patterns and groups as this is a non-gradient searching. The total number of permutations is:

$$C_N^M = N!/(M!*(N-M)!)$$

Generally, both M and N are often larger than hundreds or even thousands. Thus, the total number of permutations is an extremely large number. This makes traversing all of the permutations difficult within a limited and feasible amount of time.

In an embodiment, a different method may be used to select M samples from N candidates. In an embodiment, the target number 467 of representative patterns 448 is determined based on stop criteria and/or other information. The stop criteria are configured to facilitate the variation in training pattern 449. The stop criteria may be determined based on information from prior training patterns, entered and/or selected by a user, determined at manufacture of the present apparatus, and/or determined in other ways. In an embodiment, method 400 comprises determining an amount of variation in training pattern 449. In an embodiment, the stop criteria are configured to ensure the amount of variation in training pattern 449 breaches a variation amount threshold. The variation amount threshold may be determined based on information from prior training patterns, entered and/or selected by a user, determined at manufacture of the present apparatus, and/or determined in other ways.

In an embodiment, the target number 467 of representative patterns 448 is randomly selected (e.g., randomly select patterns from M groups) from a total number (N) of individual groups 447. In an embodiment, the target number of representative patterns is re-randomly selected responsive to the amount of variation in the training pattern not breaching the variation amount threshold, responsive to an amount of variation in a subsequently selected training pattern 449 increasing relative to an immediately previous iteration of training pattern 449, and/or for other reasons. For example, an amount of variation in training pattern 449 may be determined after an iteration of randomly selecting patterns from M groups from the total number of N groups. Training pattern 449 may be updated (e.g., the randomly selected patterns that make up training pattern 449 may be randomly reselected) if the variation of a current iteration is larger than a previous one (e.g., because increased variation is desired). The stop criteria may be and/or include a maximum number of iterations (e.g., N_iter>max_iter) an amount of variation breaching a threshold (e.g., variation >=threshold), a breach of a maximum iteration time, and/or other stop criteria. This searching method is time-feasible and is able to drive a training set with (e.g., good-enough) variation.

In an embodiment, method 400 further comprises providing (not shown in FIG. 4) training pattern 449 to a deep convolutional neural network and/or other machine learning models to train the deep convolutional neural network. In an embodiment, method 400 further comprises performing (also not shown in FIG. 4) optical proximity correction as part of a wafer patterning process using the trained deep convolutional neural network. For example, training pattern 449 (e.g., generated based on a full-chip GDS as described herein) may be provided to train a deep convolutional neural network and/or other machine learning models to predict a CTM map. Training pattern 449 (e.g., a continuous transmission mask (CTM) image) is a representative pattern set provided to a machine learning model (e.g., a DCNN) for training, so that an accurate CTM map will be predicted by the machine learning model (e.g., the DCNN) for a full-chip OPC application, for example. This more accurate CTM map results in fewer lithography hotspots and less process window limitations, and/or reduces difficulty during subsequent mask correction operations when trying to meet lithography performance specifications (e.g., related to aerial images, resist images, etc.). Other applications of method 400 are contemplated.

Figure 10:
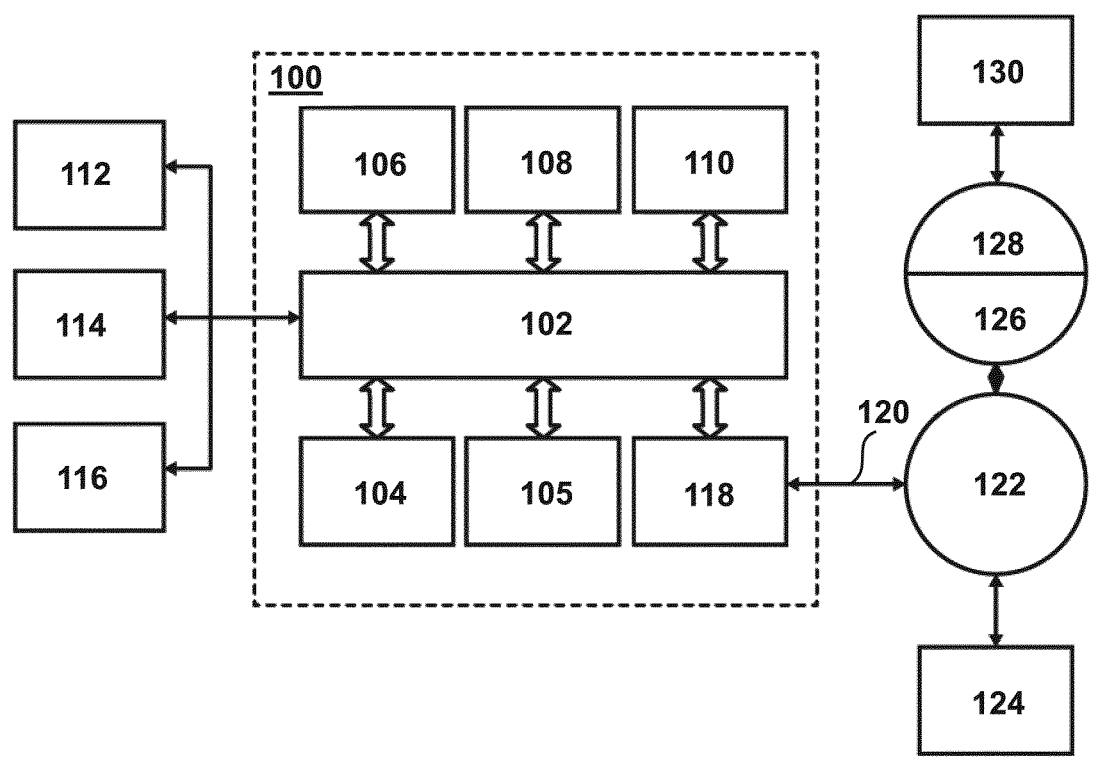
FIG. 10 is a block diagram of an example computer system, according to an embodiment.

FIG. 10 is a block diagram that illustrates a computer system 100 that can assist in implementing the methods, flows, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 11:
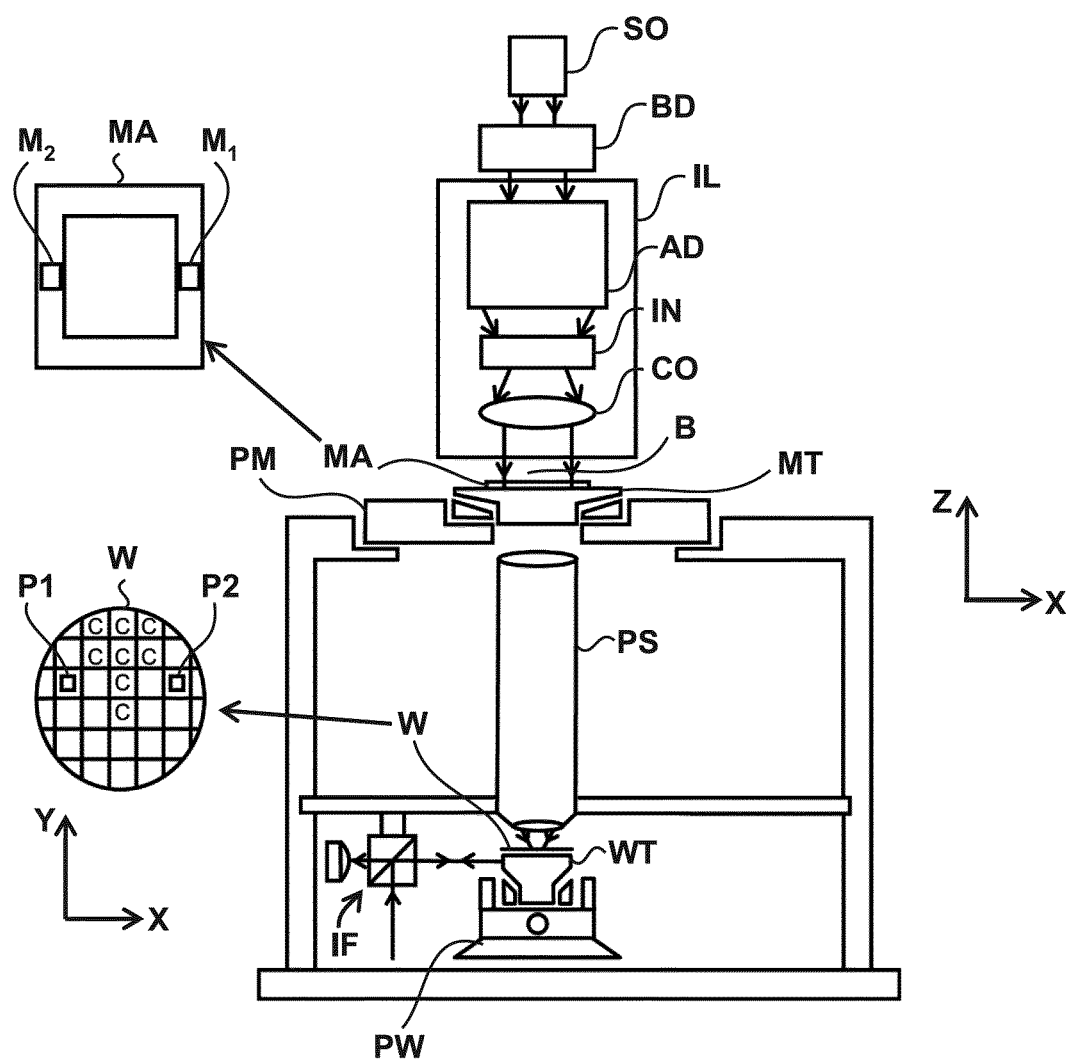
FIG. 11 is a schematic diagram of a lithographic projection apparatus, according to an embodiment.

FIG. 11 schematically depicts an exemplary lithographic projection apparatus that may be utilized in conjunction with the techniques described herein. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS; and
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device relative to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 11. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 12:
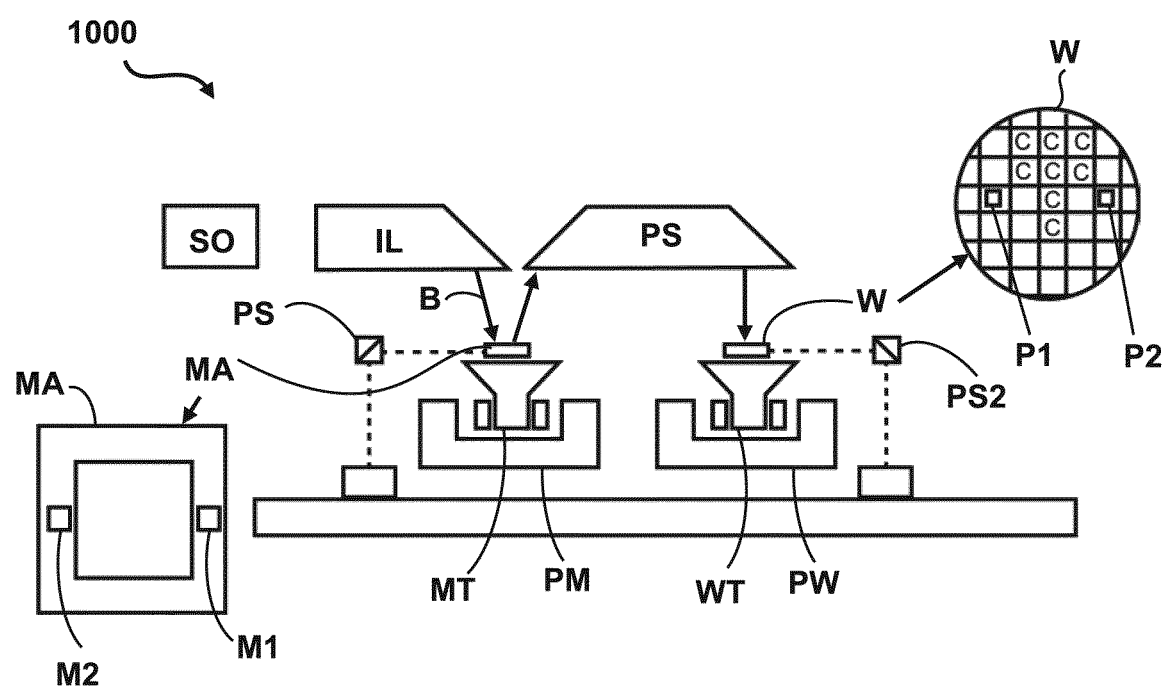
FIG. 12 is a schematic diagram of another lithographic projection apparatus, according to an embodiment.

FIG. 12 schematically depicts another exemplary lithographic projection apparatus 1000 that can be utilized in conjunction with the techniques described herein.

The lithographic projection apparatus 1000 comprises:
- a source collector module SO
- an illumination system (illuminator) IL configured to condition a radiation beam B (e.g. EUV radiation).
- a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As depicted in FIG. 12, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

The illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 12, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source. In an embodiment, a DUV laser source may be used.

The illuminator IL may comprise an adjuster for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 13:
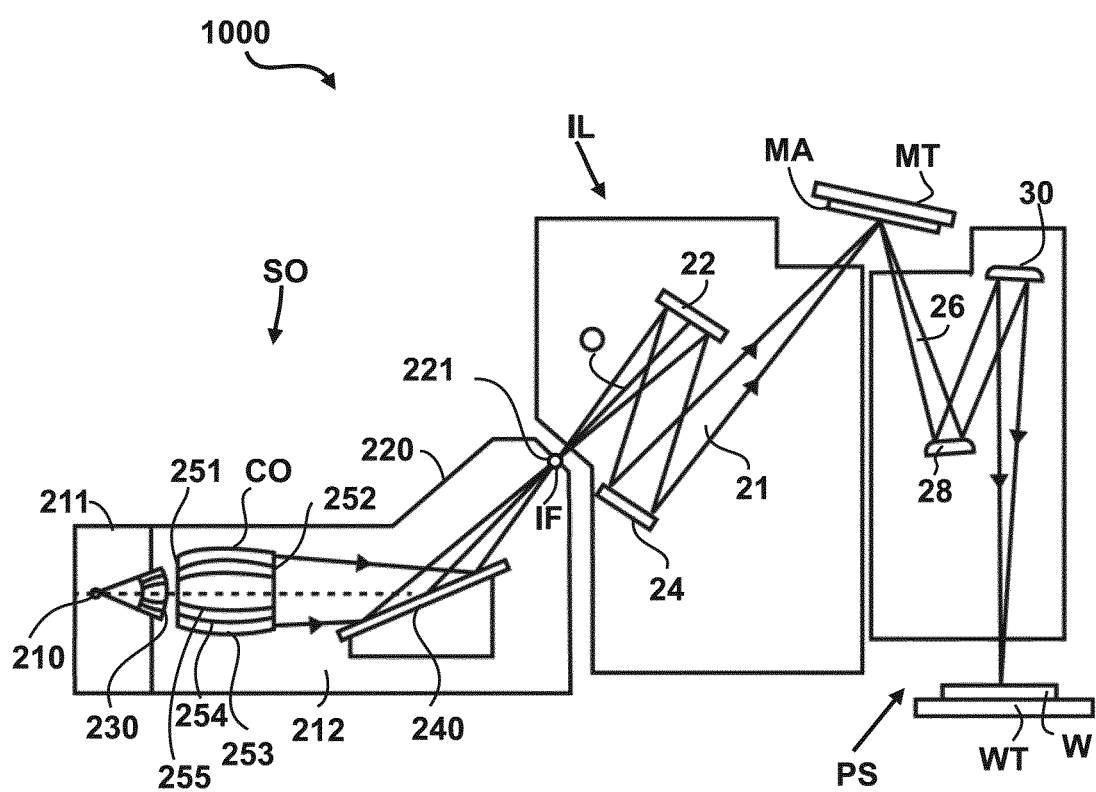
FIG. 13 is a more detailed view of the apparatus in FIG. 12, according to an embodiment.

FIG. 13 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Figure 14:
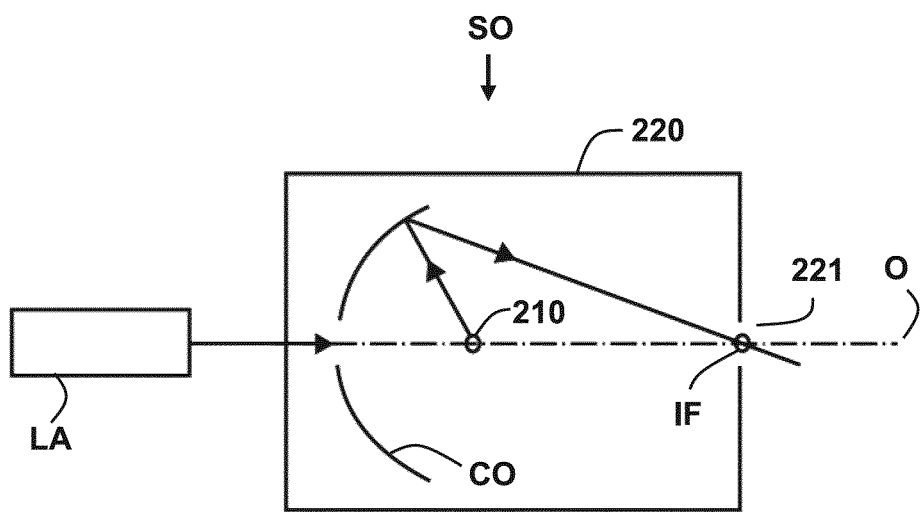
FIG. 14 is a more detailed view of the source collector module SO of the apparatus of FIG. 12 and FIG. 13, according to an embodiment.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Alternatively, the source collector module SO may be part of an LPP radiation system as shown in FIG. 14. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for training a machine learning model for a layout patterning process, the method comprising:
    generating a plurality of features from patterns in a pattern set;
    grouping the patterns in the pattern set into individual groups based on similarities in the plurality of generated features; and
    providing representative patterns from the individual groups to the machine learning model to train the machine learning model to predict a continuous transmission mask (CTM) map for optical proximity correction (OPC) for the layout patterning process.

2. The method of clause 1, wherein the plurality of features generated from the patterns in the pattern set are in addition to geometrical information and/or vertex information already included in the pattern set.

3. The method of clause 1 or 2, wherein the OPC comprises a full-chip OPC for a wafer in the layout patterning process.

4. The method of any of clauses 1-3, wherein the plurality of generated features comprise geometrical features and lithography aware features.

5. The method of any of clauses 1-4, wherein grouping the patterns in the pattern set into individual groups based on the similarities in the plurality of generated features comprises using a machine learning clustering method to cluster the unique patterns in the pattern set into individual groups based on the similarities in the plurality of generated features.

6. A method for determining a training pattern for a layout patterning process, the method comprising:
    generating a plurality of features from patterns in a pattern set;
    grouping the patterns in the pattern set into individual groups based on similarities in the plurality of generated features; and
    selecting representative patterns from the individual groups to determine the training pattern.

7. The method of clause 6, wherein the plurality of generated features comprise geometrical features and lithography aware features.

8. The method of clause 7, wherein the geometrical features comprise one or more of target mask images, frequency maps, pattern density maps, or pattern occurrences of the unique patterns in the pattern set.

9. The method of any of clause 7 or 8, wherein the lithography aware features comprise one or more of sub-resolution assist feature guidance maps (SGM), diffraction orders, or diffraction patterns of the unique patterns in the pattern set.

10. The method of any of clauses 6-9, wherein the plurality of features generated from the patterns in the pattern set are in addition to geometrical information and/or vertex information already included in the pattern set.

11. The method of any of clauses 6-10, wherein the grouping of the patterns in the pattern set into groups based on the plurality of generated features is performed using unsupervised machine learning.

12. The method of any of clauses 6-11, wherein grouping the patterns in the pattern set into individual groups based on the similarities in the plurality of generated features comprises clustering the patterns in the pattern set into individual groups based on the similarities in the plurality of generated features.

13. The method of clause 12, wherein the clustering comprises a sequential series of clustering steps performed using different ones of the plurality of generated features for different clustering steps, the sequential series of clustering steps forming sub-groups of the unique patterns in the pattern set such that the representative patterns are selected from the sub-groups to determine the training pattern.

14. The method of clause 12 or 13, wherein the clustering comprises a machine learning clustering method.

15. The method of clause 13 or 14, wherein the sequential series of clustering steps comprise cross validation steps performed using a given feature for a given step, cross validation including adjusting which patterns are included in a given sub group.

16. The method of any of clauses 6-15, wherein selecting representative patterns from the individual groups to determine the training pattern comprises selecting a target number of representative patterns.

17. The method of clause 16, wherein the target number of representative patterns is determined based on stop criteria, the stop criteria configured to facilitate variation in the training pattern.

18. The method of clause 17, further comprising determining an amount of variation in the training pattern.

19. The method of clause 18, wherein the stop criteria are further configured to ensure the amount of variation in the training pattern breaches a variation amount threshold.

20. The method of clause 19, wherein the target number of representative patterns is randomly selected from the individual groups.

21. The method of clause 20, wherein the target number of representative patterns is re-randomly selected responsive to the amount of variation in the training pattern not breaching the variation amount threshold.

22. The method of any of clauses 6-21, wherein selecting representative patterns from the individual groups to determine the training pattern comprises selecting a most central pattern from each individual group, the most central pattern being closest to a centroid of a specified feature space for an individual group relative to other patterns in the individual group.

23. The method of clause 22, wherein the specified feature space is a target mask image feature space, a frequency map feature space, a pattern density map feature space, a pattern occurrence feature space, an SGM feature space, a diffraction order feature space, or a diffraction pattern feature space.

24. The method of any of clauses 6-23, further comprising providing the training pattern to a deep convolutional neural network to train the deep convolutional neural network.

25. The method of clause 24, further comprising performing optical proximity correction as part of a wafer patterning process using the trained deep convolutional neural network.

26. A computer program product comprising a non-transitory computer readable medium having instructions recorded thereon, the instructions when executed by a computer implementing the method of any of clauses 1-25.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
    generating a plurality of features from patterns in a pattern set, wherein the plurality of generated features comprise geometrical features and a lithography aware feature and wherein the lithography aware feature is other than, or in addition to, a structure of the patterns and comprises information relating to lithographic transfer of a pattern to a substrate;
    grouping, by a hardware computer system, the patterns in the pattern set into individual groups based on similarities in the plurality of generated features; and
    selecting representative patterns from the individual groups to determine a training pattern for a layout patterning process.

2. The method of claim 1, wherein the geometrical features comprise one or more selected from: one or more target mask images, one or more frequency maps, one or more pattern density maps, or one or more pattern occurrences of unique patterns in the pattern set.

3. The method of claim 1, wherein the lithography aware feature comprises one or more selected from: one or more sub-resolution assist feature guidance maps (SGM), one or more diffraction orders, or one or more diffraction patterns of the unique patterns in the pattern set.

4. The method of claim 1, wherein the plurality of features generated from the patterns in the pattern set are in addition to geometrical information and/or vertex information already included in the pattern set.

5. The method of claim 1, wherein the grouping of the patterns is performed using unsupervised machine learning.

6. The method of claim 1, wherein the grouping of the patterns comprises clustering the patterns in the pattern set into individual groups based on the similarities in the plurality of generated features.

7. The method of claim 6, wherein the clustering comprises a sequential series of clustering steps performed using different ones of the plurality of generated features for different clustering steps, the sequential series of clustering steps forming sub-groups of unique patterns in the pattern set such that the representative patterns are selected from the sub-groups to determine the training pattern.

8. The method of claim 6, wherein the clustering comprises a machine learning clustering method.

9. The method of claim 1, wherein the selecting representative patterns from the individual groups to determine the training pattern comprises selecting a target number of representative patterns.

10. The method of claim 9, further comprising determining an amount of variation in the training pattern and/or wherein the target number of representative patterns is randomly selected from the individual groups, and/or wherein the target number of representative patterns is re-randomly selected responsive to an amount of variation in the training pattern not breaching a variation amount threshold.

11. The method of claim 1, wherein the selecting representative patterns from the individual groups to determine the training pattern comprises selecting a most central pattern from each individual group, the most central pattern being closest to a centroid of a specified feature space for an individual group relative to other patterns in the individual group.

12. The method of claim 11, wherein the specified feature space is a target mask image feature space, a frequency map feature space, a pattern density map feature space, a pattern occurrence feature space, a sub-resolution assist feature guidance map (SGM) feature space, a diffraction order feature space, or a diffraction pattern feature space.

13. The method of claim 1, further comprising providing the training pattern to a deep convolutional neural network to train the deep convolutional neural network.

14. A computer program product comprising a non-transitory computer readable medium having instructions therein, the instructions, when executed by a computer system, configured to cause the computer system to at least:
generate a plurality of features from patterns in a pattern set, wherein the plurality of generated features comprise geometrical features and a lithography aware feature and wherein the lithography aware feature is other than, or in addition to, a structure of the patterns and comprises information relating to lithographic transfer of a pattern to a substrate;
group the patterns in the pattern set into individual groups based on similarities in the plurality of generated features; and
select representative patterns from the individual groups to determine a training pattern for a layout patterning process.

15. The computer program product of claim 14, wherein the plurality of features generated from the patterns in the pattern set are in addition to geometrical information and/or vertex information already included in the pattern set.

16. The computer program product of claim 14, wherein the instructions configured to cause the computer system to group the patterns are configured to do so using unsupervised machine learning.

17. The computer program product of claim 14, wherein the instructions configured to cause the computer system to group the patterns are further configured to cause the computer system to cluster the patterns in the pattern set into individual groups based on the similarities in the plurality of generated features.

18. The computer program product of claim 14, wherein the instructions are further configured to cause the computer system to provide the training pattern to a deep convolutional neural network to train the deep convolutional neural network.

19. The computer program product of claim 14, wherein the lithography aware feature comprise one or more selected from: one or more sub-resolution assist feature guidance maps (SGM), one or more diffraction orders, or one or more diffraction patterns of unique patterns in the pattern set.

20. The computer program product of claim 17, wherein the instructions configured to cause the computer system to cluster the patterns are further configured to cause the computer system to employ a sequential series of clustering steps performed using different ones of the plurality of generated features for different clustering steps, the sequential series of clustering steps forming sub-groups of unique patterns in the pattern set such that the representative patterns are selected from the sub-groups to determine the training pattern.

* * * * *